(12) United States Patent
Prinz

(10) Patent No.: US 6,816,414 B1
(45) Date of Patent: Nov. 9, 2004

(54) NONVOLATILE MEMORY AND METHOD OF MAKING SAME

(75) Inventor: Erwin J. Prinz, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/631,142

(22) Filed: Jul. 31, 2003

(51) Int. Cl.[7] .............................................. G11C 16/04
(52) U.S. Cl. ........................... 365/185.29; 365/185.03; 365/185.14; 365/185.27
(58) Field of Search ...................... 365/185.03, 185.14, 365/185.15, 185.25, 185.27, 185.29

(56) References Cited

U.S. PATENT DOCUMENTS

| | | | |
|---|---|---|---|
| 5,824,584 A | | 10/1998 | Chen et al. |
| 5,959,896 A | * | 9/1999 | Forbes .................. 365/185.33 |
| 5,969,383 A | | 10/1999 | Chang et al. |
| 6,166,401 A | * | 12/2000 | Forbes ........................ 257/77 |
| 6,400,610 B1 | * | 6/2002 | Sadd ..................... 365/185.29 |
| 6,563,728 B2 | * | 5/2003 | Kobayashi ................... 365/63 |
| 6,654,282 B2 | * | 11/2003 | Kanai ..................... 365/185.05 |
| 6,706,599 B1 | * | 3/2004 | Sadd et al. .................. 438/261 |
| 2002/0045315 A1 | | 4/2002 | Ogura et al. | |

OTHER PUBLICATIONS

Chang et al., "A New SONOS Memory Using Source–Side Injection for Programming," *IEEE Electron Device Letters*, Jul. 1998, vol. 19, No. 7, pp. 253–255.

* cited by examiner

*Primary Examiner*—Son Mai
(74) *Attorney, Agent, or Firm*—Michael J. Balconi-Lamica

(57) ABSTRACT

A method of discharging a charge storage location of a transistor of a non-volatile memory includes applying first and second voltages to a control gate and a well region, respectively, of the transistor. The first voltage is applied to the control gate of the transistor, wherein the control gate has at least a portion located adjacent to a select gate of the transistor. The transistor includes a charge storage location having nanoclusters disposed within dielectric material of a structure of the transistor located below the control gate. Lastly, a second voltage is applied to the well region located below the control gate. Applying the first voltage and the second voltage generates a voltage differential across the structure for discharging electrons from the nanoclusters of the charge storage location.

25 Claims, 2 Drawing Sheets

US 6,816,414 B1

NONVOLATILE MEMORY AND METHOD OF MAKING SAME

FIELD OF THE INVENTION

The present disclosure relates, in general to memory devices, and more particularly, to a nonvolatile memory device and method of making the same.

RELATED ART

It has been shown that non-volatile memory single-transistor bitcells having a dielectric with embedded silicon nanocrystals can be charged with electrons using hot carrier injection (HCI injection), HCI injection with reverse well/ source bias, or Fowler-Nordheim (FN) tunneling. The nanocrystals can be discharged with Fowler-Nordheim tunneling through either a top or a bottom dielectric with respect to the nanocrystals. The array architecture considerations of either FN tunneling program/erase or HCI program/FN erase for single-transistor bitcells are also understood. While vertical FN programming is a very low current operation, it results in a long programming time (e.g., on the order of 1–10 msec) and an inefficient bitcell with either two transistors per bitcell or two parallel conductors in a bitline direction. HCI programming results in an efficient bitcell and fast programming (e.g., on the order of 1–10 $\mu$sec) at the expense of high programming current (e.g., on the order of 100–200 $\mu$A).

It also has been shown that source-side injection in a split-gate bitcell in combination with an oxide-nitride-oxide (ONO) storage layer can be used with either hot hole erase or with erase through the thin top oxide of a SONOS device. However, hot hole erase results in oxide degradation leading to read disturb, and thin top oxide erase of an ONO layer results in susceptibility to read disturb for erase times on the order of between 100 msec to 1 sec.

Accordingly, a bitcell combining high reliability program/ erase operations and low write power is needed.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present disclosure.

DETAILED DESCRIPTION

Figure 1:
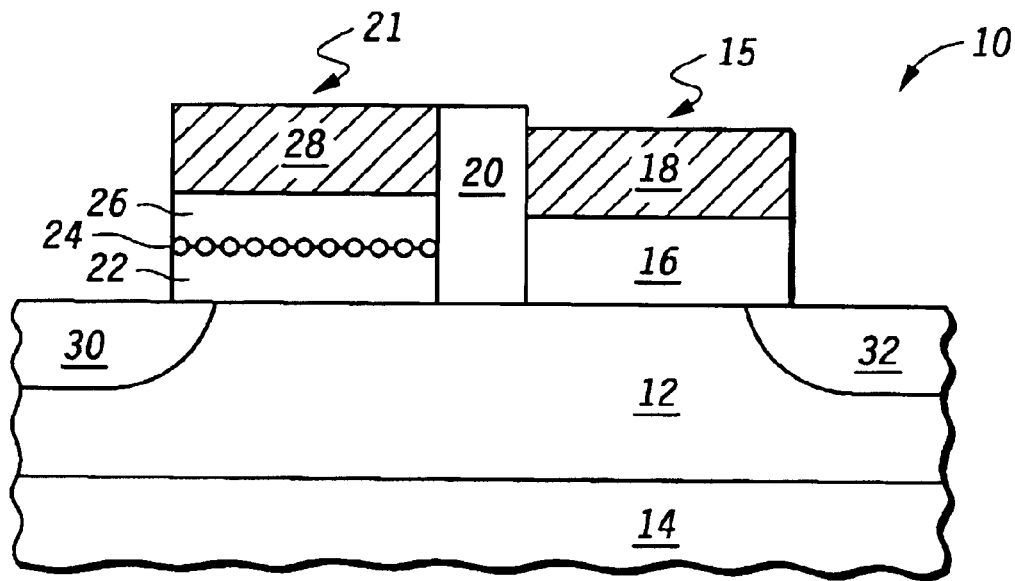
FIG. 1 is a cross-sectional view of a nonvolatile memory device having a split gate with nanoclusters embedded within a dielectric layer for charge storage according to one embodiment of the present disclosure.

FIG. 1 is a cross-sectional view of a nonvolatile memory device 10 having a split gate with nanoclusters embedded within a dielectric layer for charge storage according to one embodiment of the present disclosure. Memory device 10 includes a substrate having a bitcell well 12 of a first conductivity type overlying a deep well 14 of a second conductivity type, opposite the first conductivity type. In one embodiment, the first conductivity type includes p-type and the second conductivity type includes n-type dopant.

Memory device 10 also includes a select gate transistor 15, the select gate transistor including gate dielectric 16 and gate electrode 18. Memory device 10 further includes a control gate transistor 21, the control gate transistor including at least a first dielectric 22, a layer of nanoclusters 24, a second dielectric 26, and a gate electrode 28. In one embodiment, the structure of first dielectric 22, layer of nanoclusters 24, and second dielectric 26 form a charge storage structure, the nanoclusters being used for charge storage. In addition, the first dielectric 22 includes a top oxide/nanocluster surface and forms an F/N tunneling dielectric. The second dielectric 26 includes a bottom oxide/ nanocluster surface and forms the bottom dielectric. In one embodiment, the nanoclusters comprise silicon nanocrystals.

The select gate transistor 15 is separated from the control gate transistor 21 by a narrow dielectric 20. Narrow dielectric 20 has a dimension on the order of less than 200 angstroms (<20 nm) between the select gate and control gate transistors. Narrow dielectric 20 can include, for example, a narrow oxide sidewall dielectric. Memory device 10 also includes source/drain regions 30 and 32. The various layers and doped regions, as discussed herein, of memory device 10 can be fabricated, respectively, using techniques known in the art.

In one embodiment, the memory device 10 includes a split gate device in which a layer of nanoclusters is embedded between first and second dielectric layers, wherein the split gate device is utilized for non-volatile charge storage. That is, the split gate device has a control gate transistor with nanoclusters embedded between a bottom and top dielectric, and a select gate transistor with a gate dielectric. The first and second dielectric layers include dielectrics having a thickness on the order of 35–70 Å. In addition, the transistors of the split gate device are separated by a narrow dielectric area, such that source side injection is possible.

Examples of source side injection with biases as applied to the 1-bit storage cell of memory device 10 are provided in Table 1 and Table 2. That is, Table 1 provides various bitcell operating voltages for carrying out an erase operation performed with Fowler-Nordheim tunneling through the top dielectric 26 of the 1-bit storage cell of memory device 10. In addition, Table 2 provides various bitcell operating voltages for carrying out an erase operation performed with Fowler-Nordheim tunneling through the bottom dielectric 22 of the 1-bit storage cell of memory device 10. Read current flows in the opposite direction to the write current.

In the embodiment of FIG. 1, the bitcell operating voltages are as follows. Bitcell well 12 of memory device 10 includes a p-type well at a bitcell well voltage, Vpw. Select gate 18 includes a polysilicon select gate, wherein a select gate voltage, Vsg, is applied to the same. Control gate 28 includes a polysilicon control gate, wherein a control gate voltage, Vcg, is applied to the same. Source and drain regions (30, 32) are at respective source/drain voltages, Vsource/Vdrain. In the tables, Vdd represents a positive supply voltage, b/c Vt represents the bitcell threshold voltage, and "float" represents neither coupled to a voltage or ground.

Such a high voltage oxide is similar to an input/output transistor (I/O) oxide. The 90 Å-thick oxide is necessary if the bitcell well 12 is biased at +6V or −6V to enable splitting the erase voltages between the bitcell well 12 and a corresponding control gate.

TABLE 1

Bitcell operating voltages for erase through top oxide for 1-bit storage.

| Terminal | Source | Select Gate | Control Gate | Drain | Bitcell P-Well | Deep N-Well |
|---|---|---|---|---|---|---|
| Programming, selected bitcell | 5 V | 1 V | 5 V | 0 V | 0 V | Vdd |
| Programming, unselected bitcell | 5 V | 0 V | 0 V or 5 V | 5 V | 0 V | Vdd |
| Erase, selected sector | −6 V or float | −6 V or 0 V | 6 V | −6 V or float | −6 V | 0 V |
| Erase, unselected sector | 0 V or float | 0 V | 0 V | 0 V or float | 0 V | 0 V |
| Read, selected bitcell | 0 V | Vdd | Vdd or 0 V, but >b/c Vt | 1 V | 0 V | Vdd |
| Read, unselected bitcell | 0 V | 0 V | Vdd or 0 V, but >b/c Vt | 0 V | 0 V | Vdd |

TABLE 2

Bitcell operating voltages for erase through bottom oxide for 1-bit storage.

| Terminal | Source | Select Gate | Control Gate | Drain | Bitcell P-Well | Deep N-Well |
|---|---|---|---|---|---|---|
| Programming, selected bitcell | 5 V | 1 V | 5 V | 0 V | 0 V | Vdd |
| Programming, unselected bitcell | 5 V | 0 V | 0 V or 5 V | 5 V | 0 V | Vdd |
| Erase, selected sector | 6 V or float | 0 V | −6 V | 6 V or float | 6 V | 6 V |
| Erase, unselected sector | 0 V or float | 0 V | 0 V | 0 V or float | 0 V | 0 V |
| Read, selected bitcell | 0 V | Vdd | Vdd or 0 V, but > b/c Vt | 1 V | 0 V | Vdd |
| Read, unselected bitcell | 0 V | 0 V | Vdd or 0 V, but > b/c Vt | 0 V | 0 V | Vdd |

Figure 2:
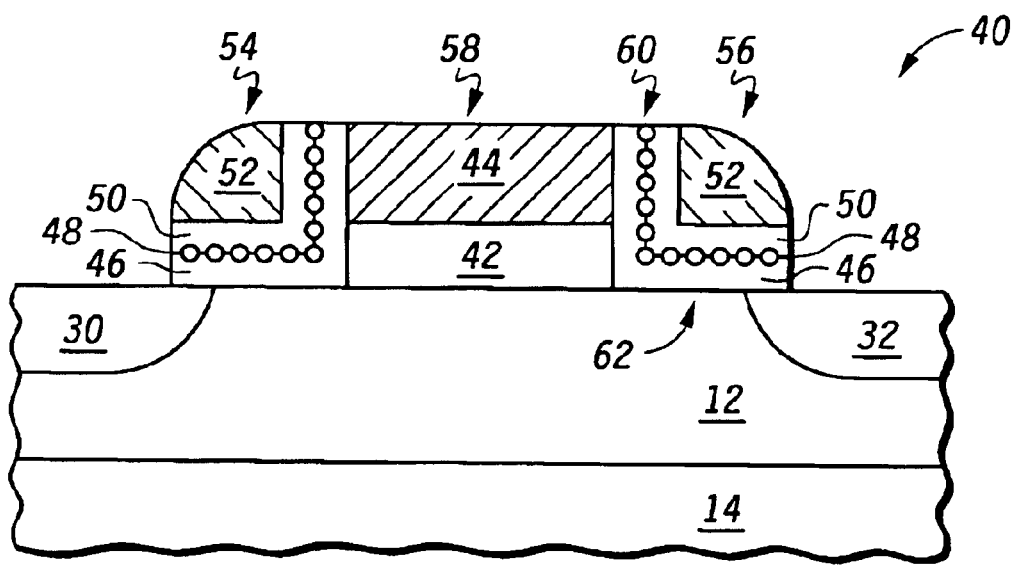
FIG. 2 is a cross-sectional view of a nonvolatile memory device having a split gate with nanoclusters embedded within a dielectric layer and disposed under polysilicon spacers according to another embodiment of the present disclosure.

FIG. 2 is a cross-sectional view of a nonvolatile memory device 40 having a split gate with nanoclusters embedded within a dielectric layer and disposed under polysilicon spacers according to another embodiment of the present disclosure. In the embodiment of FIG. 2, the device 40 is built with control gates 52 formed by poly spacers. Accordingly, two bits can be stored, one bit on either side of the select gate 44.

In one embodiment, a write operation for the device 40 of FIG. 2 has a low programming current on the order of approximately 1–10 µA and a fast programming time on the order of approximately 1–10 µsec. The erase operation operates on a block of bitcells with low erase current and an erase time on the order of approximately 10–100 msec. In typical non-volatile memory devices, the select gate uses a thin gate oxide on the order of approximately 50–100 Å oxide, wherein the thin gate oxide is similar to a low voltage transistor oxide. However, in device 40 of the present disclosure, the select gate 44 includes a high voltage oxide with a thickness on the order of approximately 70–90 Å.

In another embodiment, the device 40 includes a nanocluster-based memory device having select gate transistor 58; a thin film storage stack consisting of a bottom oxide 46 having a thickness on the order of 50–70 Å, a layer of nanoclusters 48 on the order of 20–25% surface coverage, and a top oxide 50 of a high temperature oxide (HTO) having a thickness on the order of approximately 50 Å; and sidewall spacer control gates 52 on both sides of the select gate 44, over the thin film storage (TFS) stack. Top oxide 50 includes HTO since HTO is a deposited oxide and minimizes the number of electron or hole trap sites in the deposited oxide, as compared with a large number of electron or hole trap sites in a low temperature oxide (e.g., TEOS). Accordingly, the thin film storage stack includes top oxide 50, nanoclusters 48, and bottom oxide 46 in the region disposed below a respective gate electrode 52. In addition, memory device 40 is configured for source-side injection programming and for Fowler-Nordheim tunneling erase through the top oxide 50. The various layers and doped regions, as discussed herein, of memory device 40 can be fabricated, respectively, using techniques known in the art.

Examples of source side injection with biases as applied to the 2-bit storage cell of memory device 40 are provided in Table 3 and Table 4. That is, table 3 provides various bitcell operating voltages for carrying out an erase operation performed with Fowler-Nordheim tunneling through the top dielectric 50 of the 2-bit storage cell of memory device 40. In addition, table 4 provides various bitcell operating voltages for carrying out an erase operation performed with Fowler-Nordheim tunneling through the bottom dielectric 46 of the 2-bit storage cell of memory device 40. Read current flows in the opposite direction to the write current.

In the embodiment of FIG. 2, the bitcell operating voltages are as follows. Bitcell well 12 of memory device 10 includes a p-type well at a bitcell well voltage, Vpw. Select gate 44 includes a polysilicon select gate, wherein a select gate voltage, Vsg, is applied to the same. Control gates 52 include polysilicon control gates, wherein a first and second control gate voltage, Vcg1, Vcg2, is applied to the same, respectively. Source and drain regions (30, 32) are at respective source/drain voltages, Vsource/Vdrain. In the tables, Vdd represents a positive supply voltage, b/c Vt represents the bitcell threshold voltage, Vo represent a programmed threshold voltage in which the nanocrystals are charged with one or more electrons, and "float" represents neither coupled to a voltage or ground.

TABLE 3

Bitcell operating voltages for erase through top oxide for 2-bit storage.

| Terminal | Source | Select Gate | Control Gate 1 | Control Gate 2 | Drain | Bitcell P-Well | Deep N-Well |
|---|---|---|---|---|---|---|---|
| Programming, selected bitcell, left bit | 5 V | 1 V | 5 V | 5 V or 0 V | 0 V | 0 V | Vdd |
| Programming, selected bitcell, right bit | 0 V | 1 V | 5 V or 0 V | 5 V | 5 V | 0 V | Vdd |
| Programming, unselected bitcell | 5 V | 0 V | 0 V or 5 V | 0 V or 5 V | 5 V | 0 V | Vdd |
| Erase, selected sector | −6 V or float | −6 V or 0 V | 6 V | 6 V | −6 V or float | −6 V | 0 V |
| Erase, unselected sector | 0 V or float | 0 V | 0 V | 0 V | 0 V or float | 0 V | 0 V |
| Read, selected bitcell | 0 V | Vdd | Vdd or 0 V, but >b/c Vt | (Vdd + Vo) or Vo | 1 V | 0 V | Vdd |
| Read, unselected bitcell | 0 V | 0 V | (Vdd + Vo) or Vo | Vdd or 0 V, but >b/c Vt | 0 V | 0 V | Vdd |

TABLE 4

Bitcell operating voltages for erase through bottom oxide for 2-bit storage.

| Terminal | Source | Select Gate | Control Gate 1 | Control Gate 2 | Drain | Bitcell P-Well | Deep N-Well |
|---|---|---|---|---|---|---|---|
| Programming, selected bitcell, left bit | 5 V | 1 V | 5 V | 5 V or 0 V | 0 V | 0 V | Vdd |
| Programming, selected bitcell, right bit | 0 V | 1 V | 5 V or 0 V | 5 V | 5 V | 0 V | Vdd |
| Programming, unselected bitcell | 5 V | 0 V | 0 V or 5 V | 0 V or 5 V | 5 V | 0 V | Vdd |
| Erase, selected sector | 6 V or float | 0 V | −6 V | −6 V | 6 V or float | 6 V | 6 V |
| Erase, unselected sector | 0 V or float | 0 V | 0 V | 0 V | 0 V or float | 0 V | 0 V |
| Read, selected bitcell, left bit | 0 V | Vdd | Vdd or 0 V, but >b/c Vt | (Vdd + Vo) or Vo | 1 V | 0 V | Vdd |
| Read, selected bitcell, right bit | 0 V | Vdd | (Vdd + Vo) or Vo | Vdd or 0 V, but >b/c Vt | 1 V | 0 V | Vdd |
| Read, unselected bitcell | 0 V | 0 V | Vdd or 0 V, but >b/c Vt | Vdd or 0 V, but >b/c Vt | 0 V | 0 V | Vdd |

Figure 3:
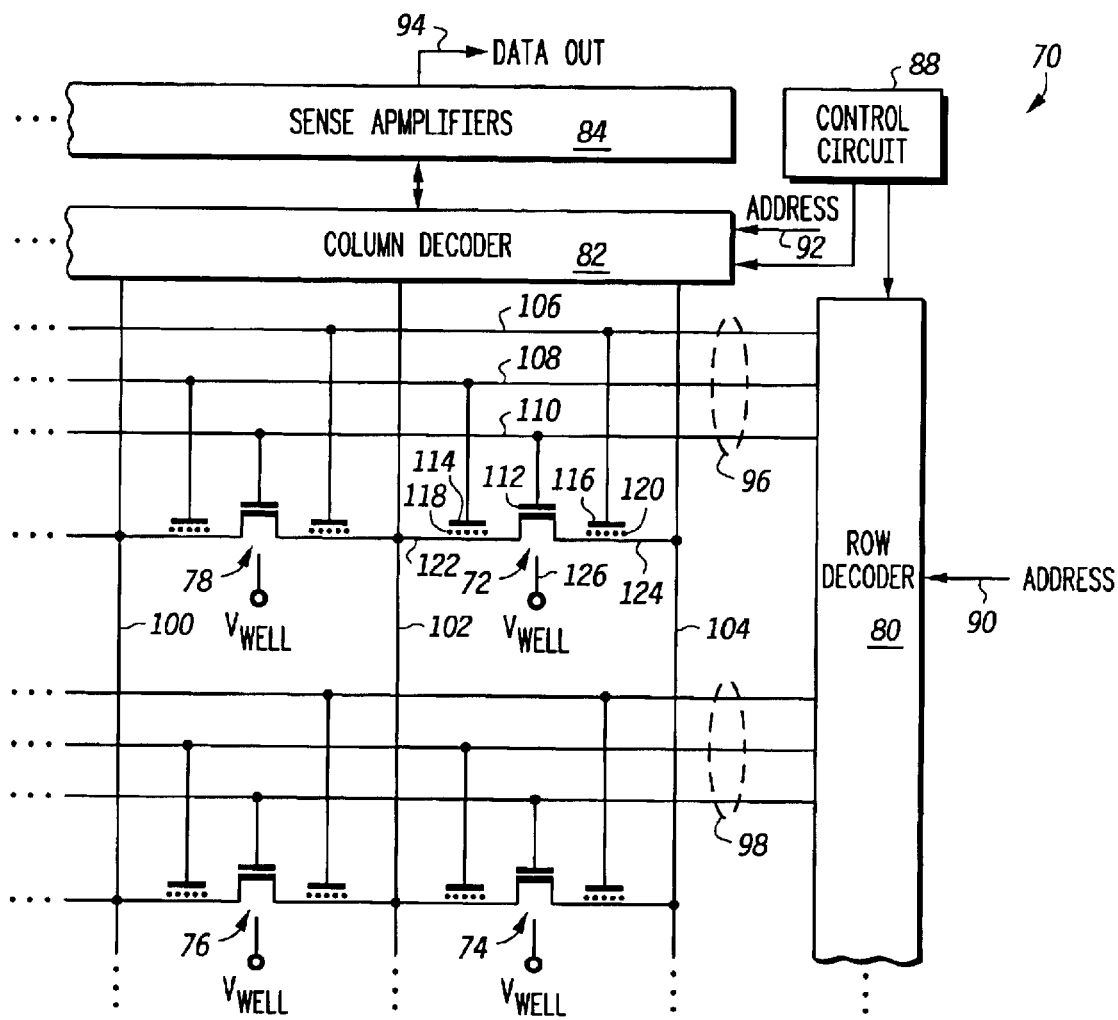
FIG. 3 is a schematic diagram of a nonvolatile memory device according to another embodiment of the present disclosure.

FIG. 3 is a schematic diagram of a nonvolatile memory device 70 according to another embodiment of the present disclosure. Memory device 70 includes an array of bit cells arranged in rows and columns, including bit cells according to the various embodiments disclosed herein, indicated by reference numerals 72, 74, 76, and 78, for example. Memory device 70 further includes a row decoder 80, column decoder 82, sense amplifiers 84, and control circuit 88 for controlling row decoder 80 and column decoder 82. Row decoder 80 receives address information via address input 90. Column decoder 82 receives address information via address input 92. Sense amplifiers receive signal information from column decoder 82 and output the amplified information or data out on data output 94. Row decoder 80 decodes address information received on address input 90 and outputs information on appropriate word lines 96, 98. Column decoder 82 decodes address information received on address input 92 and receives information via bit lines 100, 102, 104.

In one embodiment, the bit cell 72 includes a memory device having a select gate transistor 112 and sidewall transistors 114, 116 disposed on opposite sides of gate transistor 112. Sidewall transistors 114 and 116 include dielectric nanocluster thin film storage memory stacks 118 and 120, respectively. The dielectric nanocluster thin film storage memory stacks 118 and 120 comprise stacks similar to those of FIGS. 1, 2 or 4. Bit cell 72 further includes source/drain regions 122 and 124 coupled to corresponding bit lines 102 and 104, respectively. Still further, bit cell 72 includes a deep well region coupled to a voltage potential VWE, as indicated by reference numeral 126.

Figure 4:
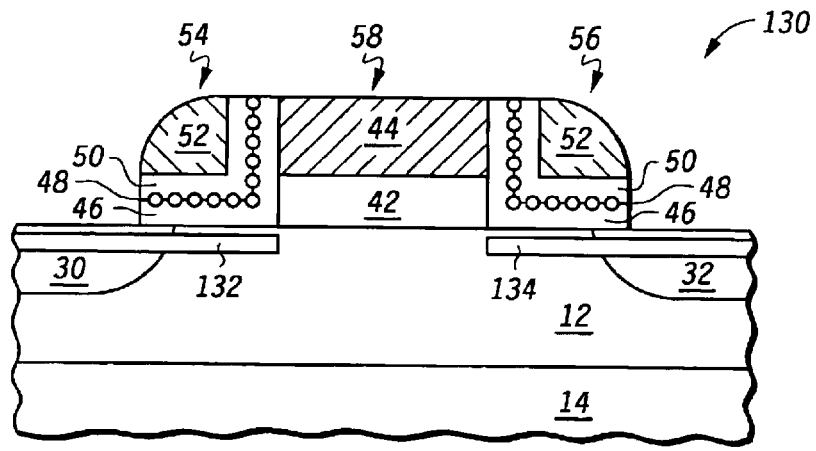
FIG. 4 is a cross-sectional view of a nonvolatile memory device including a shallow implant according to another embodiment of the present disclosure.

FIG. 4 is a cross-sectional view of a nonvolatile memory device 130 including shallow implants (132, 134) according to another embodiment of the present disclosure. No assumptions have been made for the charge-neutral control gate threshold voltage of the spacer device of control gate transistors (54, 56). Using shallow antimony or arsenic implants (132, 134) performed after select gate formation (44), the threshold voltage Vt of a respective spacer device can be below zero volts (0 V), thereby alleviating the need for biasing the control gates during a read operation. In other words, the memory device 40 is fabricated with a selectively lower channel doping under a respective spacer device using self-aligned counter doped implants of arsenic (As) or antimony (Sb). Counter dopants of As and Sb are selected due to their ability to not substantially diffuse in subsequent processing steps. In addition, the spacer devices have a channel region on the order of approximately 200–1000 angstroms, i.e., short channel device. Accordingly, the threshold voltage of the spacer devices is lowered without degradation of performance characteristics of the short channel spacer devices.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of discharging a charge storage location of a transistor, the method comprising:

applying a first voltage to a control gate of a transistor, the control gate having at least a portion located adjacent to a select gate of the transistor, wherein the transistor includes a charge storage location including nanoclusters disposed within dielectric material of a structure of the transistor located below the control gate; and applying a second voltage to a well region located below the control gate, wherein the applying the first voltage and the applying the second voltage generates a voltage differential across the structure for discharging electrons from the nanoclusters of the charge storage location.

2. The method of claim 1, wherein the nanoclusters of the charge storage location includes nanocrystals.

3. The method of claim 1, wherein the transistor includes a dielectric material located between the control gate and the select gate.

4. The method of claim 3, wherein the transistor further includes nanoclusters disposed within the dielectric material located between the control gate and the select gate.

5. The method of claim 1, further comprising:

applying the second voltage to a current terminal region concurrently with the applying the second voltage to the well region.

6. The method of claim 1, further comprising:

applying a third voltage to the select gate concurrently with the applying the first voltage to the control gate, wherein the third voltage is approximately in a range from equal to the second voltage to equal to 0 volts.

7. The method of claim 1, wherein the transistor further includes a second control gate located on an opposite side of the select gate from the control gate, the transistor further includes a second charge storage location including nanoclusters disposed in dielectric material of a second structure of a transistor and includes dielectric material located between the second control gate and the select gate, wherein discharging a charge stored in the second charge storage location comprises:

applying a third voltage to the second control gate; and applying a fourth voltage to a well region located below the second control gate, wherein the applying the third voltage and the applying the fourth voltage generates a voltage differential across the second structure for discharging electrons from the nanoclusters of the second charge storage location.

8. The method of claim 7, wherein the first voltage is equal to the third voltage and the second voltage is equal to the fourth voltage.

9. The method of claim 1, wherein the first voltage is greater than 0 volts and the second voltage is less than 0 volts.

10. The method of claim 1, wherein the applying the first voltage and the applying the second voltage is performed during a discharge process characterized as a Fowler-Nordheim tunneling discharge process.

11. A memory array including a plurality of memory cells, wherein each memory cell includes a transistor comprising:
   a control gate locate over a substrate;
   a select gate located over the substrate, the control gate including at least a portion located adjacent to the select gate;
   a charge storage location including nanoclusters disposed in dielectric material located between the control gate and the substrate;
   dielectric material located between the control gate and select gate;
   a first current terminal region in the substrate;
   a second current terminal region in the substrate; and
   a channel region in the substrate located between the first current terminal region and the second current terminal region, wherein the control gate is located over at least a first portion of the channel region and the select gate is located over at least a second portion of the channel region.

12. The memory array of claim 11, wherein the transistor of each memory cell of the plurality further comprises:
   a second control gate located over the substrate on an opposite side of the select gate from the control gate;
   a second charge storage location including nanoclusters disposed in dielectric material located between the second control gate and the substrate; and
   dielectric material located between the second control gate and the select gate, wherein the second control gate is located over at least a third portion of the channel region.

13. The memory array of claim 11, wherein the transistor of each memory cell of the plurality further comprises:
   nanoclusters disposed in the dielectric material located between the control gate and the select gate.

14. The memory array of claim 11, wherein for the transistor of each memory cell of the plurality, the nanoclusters of the charge storage location includes nanocrystals.

15. The memory array of claim 11, wherein the memory cells of the plurality are arranged in rows and columns, the memory array further comprising:
   a first plurality of word lines, wherein each word line of the first plurality is coupled to the control gate of the transistor of each memory cell of a plurality of memory cells located in a column of the array; and
   a second plurality of word lines, wherein each word line of the second plurality is coupled to the select gate of the transistor of each memory cell of a plurality of memory cells located in a column of the array.

16. The memory array of claim 15, further comprising:
   a plurality of bit lines, wherein each bit line of the plurality is coupled to a current terminal region of the transistor of each memory cell of a plurality of memory cells located in a row of the array.

17. The memory array of claim 15, wherein the transistor of each memory cell further includes a second control gate located over the substrate on an opposite side of the select gate from the control gate and further includes a second charge storage location including nanoclusters disposed in dielectric material located between the second control gate and the substrate, the memory array further comprising:
   a third plurality of word lines, wherein each word line of the third plurality is coupled to the second control gate of the transistor of each memory cell of a plurality of memory cells located in a column of the array.

18. The memory array of claim 11, wherein for the transistor of each memory cell of the plurality, and the first portion of the channel region has a lower threshold voltage than a threshold voltage of the second portion of the channel region.

19. The memory array of claim 11, wherein for the transistor of each memory cell of the plurality, the first portion of the channel includes dopant characterized as having a low diffusion characteristic, and wherein the second portion is substantially void of the dopant.

20. The apparatus of claim 19, wherein the dopant includes at least one of antimony and arsenic.

21. The memory array of claim 11, further comprising:
   a well region in the substrate, the well region being oppositely doped with respect to the first current terminal and the second current terminal region of the transistor of each memory cell of the plurality, wherein for the transistor of each memory cell of the plurality, the charge storage location is discharged by applying a first voltage to the control gate and a second voltage to the well region to generate a voltage differential across the dielectric material located between the control gate and the well region for discharging electrons from the nanoclusters of the charge storage location.

22. A method of discharging charge storage locations of transistors of plurality of memory cells located in a row of a memory array, the method comprising:
   applying a first voltage to a word line, wherein each memory cell of a plurality of memory cells located in a row of a memory array includes a transistor having a charge storage location including nanoclusters disposed in dielectric material located between a control gate of the transistor and a substrate, wherein the control gate of the transistor of each memory cell of the plurality is coupled to the word line and is located over the substrate, wherein at least a portion of the control gate of the transistor of each memory cell of the plurality is located adjacent to a select gate of the transistor with dielectric material located between the control gate and the select gate; and
   applying a second voltage to a well region in the substrate, wherein for the transistor of each memory cell of the plurality, the applying the first voltage and the applying the second voltage generates a voltage differential across the dielectric material having the nanoclusters of the charge storage location disposed therein for discharging electrons from the nanoclusters of the charge storage location.

23. The method of claim 22, further comprising:
   applying a third voltage to a second word line concurrently with applying the first voltage to the first word line, wherein the second word line is coupled to the select gate of the transistor of each memory cell of the plurality, wherein the third voltage is approximately in a range from equal to the second voltage to equal to 0 volts.

24. The method of claim 22, wherein the applying the first voltage and the applying the second voltage is performed during a discharge process characterized as a Fowler-Nordheim tunneling discharge process.

25. The method of claim 22, wherein the transistor of each memory cell of the plurality further includes a second control gate located on an opposite side of the select gate from the control gate, the transistor of each memory cell of the plurality further includes a second charge storage location including nanoclusters disposed in dielectric material located between the second control gate of the transistor and the substrate and includes dielectric material located between the second control gate and the select gate, wherein the second control gate of the transistor of each memory cell of the plurality is coupled to a second word line, wherein discharging a charge stored in the second charge storage location of the transistor of each memory cell of the plurality comprises:

applying a third voltage to the second word line; and applying a fourth voltage to the well region in the substrate, wherein for the transistor of each memory cell of the plurality, the applying the third voltage and the applying the fourth voltage generates a voltage differential across the dielectric material having the nanoclusters of the second charge storage location disposed therein for discharging electrons from the nanoclusters of the second charge storage location.

* * * * *